United States Patent
Ferranti et al.

(10) Patent No.: US 12,130,778 B2
(45) Date of Patent: Oct. 29, 2024

(54) METHOD AND DEVICE FOR FACILITATING STORAGE OF DATA FROM AN INDUSTRIAL AUTOMATION CONTROL SYSTEM OR POWER SYSTEM

(71) Applicant: Hitachi Energy Ltd, Zürich (CH)

(72) Inventors: Ettore Ferranti, Schleinikon (CH); Carsten Franke, Rosenheim (DE); Thomas Locher, Zürich (CH); Yvonne-Anne Pignolet, Zürich (CH); Sandro Schoenborn, Basel (CH); Thanikesavan Sivanthi, Würenlingen (CH); Theo Widmer, Birmenstorf (CH)

(73) Assignee: HITACHI ENERGY LTD, Zürich (CH)

( * ) Notice: Subject to any disclaimer, the term of this patent is extended or adjusted under 35 U.S.C. 154(b) by 217 days.

(21) Appl. No.: 17/616,392

(22) PCT Filed: Jun. 5, 2020

(86) PCT No.: PCT/EP2020/065649
§ 371 (c)(1),
(2) Date: Dec. 3, 2021

(87) PCT Pub. No.: WO2020/245374
PCT Pub. Date: Dec. 10, 2020

(65) Prior Publication Data
US 2022/0245096 A1   Aug. 4, 2022

(30) Foreign Application Priority Data
Jun. 5, 2019   (EP) .................................. 19178528

(51) Int. Cl.
*G06F 7/00* (2006.01)
*G06F 16/174* (2019.01)
*H03M 7/30* (2006.01)

(52) U.S. Cl.
CPC ...... *G06F 16/1744* (2019.01); *H03M 7/3059* (2013.01); *H03M 7/6064* (2013.01); *H03M 7/70* (2013.01)

(58) Field of Classification Search
CPC .. G06F 16/1744; G06F 16/164; G06F 16/137; H03M 7/3059; H03M 7/70; H03M 7/30; H03M 7/6064; H03M 7/6094
See application file for complete search history.

(56) References Cited

U.S. PATENT DOCUMENTS 10,084,476 B1 * 9/2018 Zhao ................... H03M 7/3084
10,120,893 B1 * 11/2018 Rocamora ............. G06N 20/00
(Continued)

FOREIGN PATENT DOCUMENTS

EP          3442125 A1      2/2019
JP       2004185490 A      7/2004
(Continued)

OTHER PUBLICATIONS

International Search Report and Written Opinion of the International Searching Authority for related PCT application No. PCT/EP2020/065649 dated Sep. 23, 2020, 15 pages.
(Continued)

*Primary Examiner* — Mohammad A Sana
(74) *Attorney, Agent, or Firm* — Procopio, Cory, Hargreaves & Savitch LLP (57) ABSTRACT

To facilitate storage of data from plural data sources of an industrial automation control system, power distribution system or power generation system, a decision making device executes a machine learning algorithm to determine a compression technique in dependence on the data source from which data originates.

16 Claims, 5 Drawing Sheets

(56) References Cited

U.S. PATENT DOCUMENTS

| | | | | |
|---|---|---|---|---|
| 10,862,938 B1* | 12/2020 | Mitchell | ............... | H04L 65/61 |
| 2017/0085481 A1 | 3/2017 | Park et al. | | |
| 2018/0350110 A1* | 12/2018 | Cho | ............... | G06T 9/004 |
| 2023/0162123 A1* | 5/2023 | Kagan | ............... | G06Q 10/04 |
| | | | | 700/286 |

FOREIGN PATENT DOCUMENTS

| | | | |
|---|---|---|---|
| JP | 2011041153 A | 2/2011 | |
| JP | 2018085117 A | 5/2018 | |
| WO | 2014/190190 A1 | 11/2014 | |
| WO | 2017/114578 A1 | 7/2017 | |
| WO | 2018/229090 A1 | 12/2018 | |
| WO | 2019/015738 A2 | 1/2019 | |

OTHER PUBLICATIONS

Park et al., "Data Compression and Prediction Using Machine Learning for Industrial IoT", 2018 International Conference on Information Networking (ICOIN), internet article, Jan. 12, 2018, XP002796514, URL:https://ieeexplore.ieee.org/stamp/stamp.jsp?tp=&amnumber=8343232, Secitions I, III, and IV, 4 pages.

Anonymous, "Data Compression", Wikipedia, Aug. 18, 2020, XP055723301, URL:https://en.wikipedia.org/wiki/Data_compression#Machine_learning, 18 pages.

Anonymous, "Autoencoder", Wikipedia, May 18, 2019, XP055723231, URL:https://en.wikipedia.org/w/index.php?title=Autoencoder&oldid=897670835, 8 pages.

Anonymous, "Push technology", Wikipedia, May 17, 2019, XP055723092, URL:https://en.wikipedia.org/w/index.php?title=Push_technology&oldid=897487695, 8 pages.

Kong et al., "Embracing big data with compressive sensing: A green approach in industrial wireless networks", IEEE Communications Magazine., vol. 54, No. 10, Oct. 30, 2016, p. 53-59, XP055723261, US, ISSN: 0163-6804, DOI: 10.1109/MCOM.2016.7588229, Introduction and Green Collection Framework section, 7 pages.

Marcelloni et al., "A simple algorithm for data compression in wireless sensor networks", IEEE Communications Letters vol. 12, No. 6, Jun. 2008, XP-002796515, 4 pages.

Harvan et al., "Processing encrypted and compressed time-series data", 2017 IEEE 37th International Conference on Distributed Computing Systems, p. 1053-1062, 1063-6927/17, DOI: 10.1109/ICDCS.2017.114.

Eichinger et al., "A time-series compression technique and its application to the smart grid", The VLDB Journal, Apr. 25, 2013, http://dx.doi.org/10.1007/s00778-014-0368-8, 26 pages.

* cited by examiner

METHOD AND DEVICE FOR FACILITATING STORAGE OF DATA FROM AN INDUSTRIAL AUTOMATION CONTROL SYSTEM OR POWER SYSTEM

CROSS-REFERENCE TO RELATED APPLICATIONS

The present application is a national stage entry of International App. No. PCT/EP2020/065649, filed on Jun. 5, 2020, which claims priority to European App. No. 19178528.6, filed on Jun. 5, 2019, which are both hereby incorporated herein by reference as if set forth in full.

FIELD OF THE INVENTION

The present disclosure relates to methods and devices for facilitating storage of data from plural data sources. The present disclosure relates in particular to methods and devices that can improve storage of data provided by data sources of an industrial automation control system, IACS, power distribution system or power generation system.

BACKGROUND OF THE INVENTION

Modern power utilities, such as power generation systems, power grids, or substations, and modern industrial systems include a vast number of components, sensors, and intelligent electronic devices (IED(s)). The analysis of the data provided by such components is a formidable task.

The analysis and use of data relating to operation of industrial automation control systems (IACSs), power distribution systems, or power generation systems is important for improving ongoing control and subsequent fault analysis for such systems. Conventionally, Transmission System operators (TSOs) and Distribution System Operators (DSOs) keep a fine granular data set of measurements for some time, e.g., for the last year. In most cases, older data is aggregated and stored at a granularity of 15 minutes, far too coarse to later run meaningful analyzes and queries on the aggregated data to extract meaningful patterns and relations from past data. Thus, valuable information is lost due to the current long-term data storage strategies.

It would be beneficial to store data relating to operation of an IACS, power distribution system, or power generation system in a manner that allows a more thorough analysis to be performed also at a later time.

For illustration, it may be desirable to store data in manner that allows operators to analyze whether and how existing electrical grids could be used to satisfy increasing customer demand in a retro-perspective fashion in order to learn and further optimize their systems for future usage.

The integration of volatile renewable energy requires more analysis to ensure the stability of the electrical grids. This requires detailed renewable energy data and system loads to be stored for longer durations (such as several years) in order to ensure stable optimization and control systems.

For further illustration, a more thorough analysis of previously collected data may be desirable to determine grid extension strategies if required.

In these and other cases, detailed data are needed that have to be available for longer periods, e.g., in order to cover long-term variations such as weekly, monthly, seasonal, and yearly patterns. With current information aggregation strategies, such an analysis is either not possible or would require excessive storage requirements.

U.S. Pat. No. 8,156,232 B2 discloses an industrial automation device that includes a compression component that compresses XML data.

J. Park et al., "Data Compression and Prediction Using Machine Learning for Industrial IoT", 2018 International Conference on Information Networking (ICOIN) describes techniques for compressing industrial data using neural network regression into a representative vector with lossy compression.

SUMMARY

It is an object of embodiments to provide improved methods and devices that facilitate the storage of data originating from sensors, merging units, intelligent electronic devices (IEDs) or other components of an industrial automation control system (IACS), power distribution system, power generation system or other system. It is in particular an object to provide methods and devices that facilitate the storage of data from data sources of an IACS, power distribution system, power generation system or other system so as to reduce storage space requirements, to thereby facilitate a subsequent analysis of the data that can accommodate weekly, monthly, seasonal, and/or yearly patterns.

According to an embodiment, a machine learning approach is used to compress data in a manner that can support detailed long-term analysis while reducing the needed physical storage. This allows operators to collect more data (e.g., by reducing the communication bandwidth needed for transmitting the data from the sensors to the storage system) and to store it more efficiently over longer time intervals. Thus, data compressed using machine learning techniques enables new services and products to be provided.

The machine learning approach is able to optimize the compression by automatically choosing from various candidate compression techniques and/or determining compression parameters for each of several data sets/streams. In this way, the system can be self-optimizing, which also reduces the engineering effort.

A method according to an embodiment facilitates storage of data from plural data sources of a system. The system is an IACS, power distribution system or power generation system. The method comprises determining, using at least one integrated circuit of a decision making device, a compression technique that is to be applied to the data. The decision making device executes a machine learning algorithm to determine the compression technique in dependence on the data source from which the data originates. The method comprises causing, by the decision making device, the compression technique determined for a data source to be applied to data from that data source.

Information on changes in a compression technique that is to be employed may be provided by the decision making device to the respective data source and/or to storage devices via a push mechanism.

Determining the compression technique may comprise executing the machine learning algorithm to determine which one of several candidate compression techniques is to be applied.

The several candidate compression techniques may be predetermined compression techniques.

At least some of the candidate compression techniques may comprise correlating time-series data of several data sources.

Depending on the determined correlation (e.g., based on a threshold comparison of the determined correlation), information indicating the presence of a correlation may be transmitted by the data source and/or stored at the storage device.

Depending on the determined correlation, time-series data or frequency-domain data may be transmitted and/or stored for only one data source of the set of at least two data sources for which the time-series data is determined to be correlated.

At least some of the candidate compression techniques may comprise performing a classification and/or clustering.

Depending on a result of the classification and/or clustering, information may be transmitted and/or stored indicating that data of a set of at least two data sources is determined to belong to the same class and/or cluster.

Depending on a result of the classification and/or clustering, time-series data or frequency-domain data may be transmitted and/or stored for only one data source of the set of at least two data sources for which the time-series data is determined to belong to the same class or cluster.

Determining the compression technique may comprise executing the machine learning algorithm to determine whether compression is applied in a time domain or in a frequency domain.

Determining the compression technique may comprise executing the machine learning algorithm to determine at least one parameter of the compression technique.

The method may further comprise automatically repeating the steps of determining the compression technique and causing the compression technique to be applied.

The steps of determining the compression technique and causing the compression technique to be applied may be repeated in a regular manner.

The steps of determining the compression technique and causing the compression technique to be applied may be repeated periodically or in an event-driven manner.

Determining the compression technique may comprise executing the machine learning algorithm to generate an update of a data model or profile associated with a data source.

The method may further comprise transmitting, by the decision making device, update information relating to the update.

The decision making device may transmit the update information to the data source for which the update of the data model or profile has been determined.

The update information may include information on changes in one or several parameters of the compression technique.

The method may further comprise updating, by the data source, a compression model or profile stored locally at the data source based on received update information to thereby generate an updated compression model or profile.

The method may comprise performing, by the data source, a compression based on the updated compression model or profile.

The data source to which the update information is transmitted may comprise a sensor device or a merging unit.

The method may further comprise transmitting, by the decision making device, the update information to at least one storage device that stores the data from the data source.

The at least one storage device may be provided separately from the plural data sources.

The machine learning algorithm may determine the compression technique under a data-source dependent constraint.

The data-source dependent constraint may comprise enforcing lossless storage.

The data-source dependent constraint may comprise enforcing lossy storage.

The data-source dependent constraint may comprise enforcing time-domain data storage.

The data-source dependent constraint may comprise enforcing frequency-domain data storage.

The method may further comprise training the machine learning algorithm during operation of the IACS, power distribution system or power generation system.

Training the machine learning algorithm may comprise learning whether compression applied in a time domain or compression applied in a frequency domain is more beneficial.

The method may further comprise pre-training the machine learning algorithm using historical data.

The data output by the plurality of data sources may include data streams. The data streams may include non-packetized data.

The decision making device may determine a first compression technique to be used for data originating from a first data source and a second compression technique to be used for data originating from a second data source, the second compression technique being different from the first compression technique and the second data source being different from the first data source.

The plurality of data sources may comprise at least one intelligent electronic device (IED).

The plurality of data sources may comprise a sensor device that is operative to output digital data, in particular a data stream.

The plurality of data sources may comprise a merging unit that is operative to output digital data.

The plurality of data sources may be operative to output data relating to physical assets of the IACS, power generation system, or power distribution system.

The data relating to physical assets may comprise electric currents, voltages, switch parameters (such as switch states or operations states of switch motors), transformer condition parameters (such as parameters relating to a bushing or insulation of a transformer), or other data.

The method may further comprise compressing, by the plurality of data sources, the data prior to outputting the data using the determined compression technique, and storing the compressed data by at least one storage device.

The method may further comprise analyzing the compressed data stored in the at least one storage device.

Analyzing the stored compressed data may comprise analyzing suitability of a power distribution system or power generation system for accommodating increasing customer demands.

Analyzing the stored compressed data may comprise performing a stability analysis of a power distribution system or power generation system.

Analyzing the stored compressed data may comprise determining a grid extension strategy.

The compressed data that is analyzed may represent a time period that exceeds 24 hours.

The compressed data that is analyzed may represent a time period that exceeds 7 days.

The compressed data that is analyzed may represent a time period that exceeds 28 days.

The compressed data that is analyzed may represent a time period that exceeds 3 months.

The compressed data that is analyzed may represent a time period that exceeds 1 year.

The compressed data that is analyzed may represent a time period that is at least two years.

The compressed data that is analyzed may represent a time period that is at least three years.

A decision making device according to an embodiment is adapted to facilitate storage of data from plural data sources of an IACS, power distribution system or power generation system. The decision making device comprises at least one interface adapted to be communicatively coupled to the plural data sources, and at least one integrated circuit operative to determine a compression technique that is to be applied to the data. The decision making device is adapted to execute a machine learning algorithm to determine the compression technique in dependence on the data source from which the data originates.

The decision making device may be operative to provide information on changes in a compression technique that is to be employed to the respective data source and/or to storage devices via a push mechanism.

The at least one integrated circuit may be operative to generate control information that causes the compression technique determined for a data source to be applied to the data originating from that data source before storing the data.

The at least one integrated circuit may be operative to execute the machine learning algorithm to determine which one of several candidate compression techniques is to be applied.

The at least one integrated circuit may be operative to execute the machine learning algorithm to determine at least one parameter of the compression technique.

The at least one integrated circuit may be operative to automatically repeat the determination of the compression technique.

The at least one integrated circuit may be operative to repeat the determination of the compression technique in a regular manner.

The at least one integrated circuit may be operative to repeat the determination of the compression technique periodically or in an event-driven manner.

The at least one integrated circuit may be operative to execute the machine learning algorithm to generate an update of a data model or profile associated with a data source.

The decision making device may be operative to transmit update information relating to the update.

The update information may include information on changes in one or several parameters of the compression technique.

The decision making device may transmit the update information to the data source for which the update of the data model or profile has been determined.

The data source to which the update information is transmitted may comprise a sensor device or a merging unit.

The decision making device may be operative to transmit the update information to at least one storage device that stores the data from the data source.

The at least one storage device may be provided separately from the plural data sources.

The at least one integrated circuit may be operative to execute the machine learning algorithm to determine the compression technique under a data-source dependent constraint.

The data-source dependent constraint may comprise enforcing lossless storage.

The data-source dependent constraint may comprise enforcing lossy storage.

The data-source dependent constraint may comprise enforcing time-domain data storage.

The data-source dependent constraint may comprise enforcing frequency-domain data storage.

The at least one integrated circuit may be operative to train the machine learning algorithm during operation of the IACS, power distribution system or power generation system.

The at least one integrated circuit may be operative such that training the machine learning algorithm comprises learning whether compression applied in a time domain or compression applied in a frequency domain is more beneficial.

The machine learning algorithm may be pre-trained using historical data.

The decision making device may be operative to determine a first compression technique to be used for data originating from a first data source and a second compression technique to be used for data originating from a second data source, the second compression technique being different from the first compression technique and the second data source being different from the first data source.

A system that is an industrial automation control system, IACS, power distribution system or power generation system according to an embodiment comprises a plurality of data sources and at least one storage device to store compressed data originating from the plurality of data sources; and the decision making device of an embodiment.

The system may be operative to perform the method of an embodiment.

The decision making device may be operative to transmit update information relating to an update of a data model or profile associated with a data source. The decision making device may be operative to transmit the update information to the data source for which the update of the data model or profile has been determined. The data source may update a compression model or profile stored locally at the data source based on received update information to thereby generate an updated compression model or profile.

The update information may include information on changes in one or several parameters of the compression technique.

The data source may perform a compression based on the updated compression model or profile.

The plurality of data sources may be operative to output data streams. The data streams may include non-packetized data.

The plurality of data sources may comprise at least one intelligent electronic device (IED).

The plurality of data sources may comprise a sensor device that is operative to output digital data, in particular a data stream.

The plurality of data sources may comprise a merging unit that is operative to output digital data.

The plurality of data sources may be operative to output data relating to physical assets of the IACS, power generation system, or power distribution system.

The data relating to physical assets may comprise currents, voltages, switch parameters (such as switch states or operations states of switch motors), transformer condition parameters (such as parameters relating to a bushing or insulation of a transformer), or other data.

The plurality of data sources may be operative to compress the data prior to outputting the data using the determined compression technique. The at least one storage device may store the compressed data.

The system may further comprise an analysis device operative to analyze the stored compressed data.

The analysis device may be operative to analyze suitability of a power distribution system or power generation system for accommodating increasing customer demands.

The analysis device may be operative to perform a stability analysis of a power distribution system or power generation system.

The analysis device may be operative to determine a grid extension strategy.

The analysis device may be operative to analyze compressed data that represents a time period that exceeds 24 hours.

The analysis device may be operative to analyze compressed data that represents a time period that exceeds 7 days.

The analysis device may be operative to analyze compressed data that represents a time period that exceeds 28 days.

The analysis device may be operative to analyze compressed data that represents a time period that exceeds 3 months.

The analysis device may be operative to analyze compressed data that represents a time period that exceeds 1 year.

The analysis device may be operative to analyze compressed data that represents a time period that is at least two years.

The analysis device may be operative to analyze compressed data that represents a time period that is at least three years.

A method according to an embodiment facilitates processing of data from plural data sources of a system. The system may be an industrial automation control system, IACS, power distribution system or power generation system. The method comprises determining, using at least one integrated circuit of a decision making device, a processing technique that is to be applied to the data. The decision making device executes a machine learning algorithm to determine the processing technique in dependence on the data source from which the data originates. The method comprises causing, by the decision making device, the processing technique determined for a data source to be applied to data from that data source.

A decision making device according to another embodiment is adapted to facilitate processing of data from plural data sources. The decision making device comprises at least one interface adapted to be communicatively coupled to the plural data sources, and at least one integrated circuit operative to determine a processing technique that is to be applied to the data. The decision making device may execute a machine learning algorithm to determine the processing technique in dependence on the data source from which the data originates.

The compression techniques may be selected from Lempel-Ziv-type compression algorithms, run-length encoding, and similar approaches.

The methods and devices according to embodiments allow lossy and lossless compression profiles to be automatically generated and/or updated. The compression profiles may be dependent on the data owner. The compression profiles may represent the data to be stored. Statistical methods, neural networks, reinforcement learning or other techniques may be used to generate or update the compression profiles.

Such a procedure offers many parameters that may be modified or updated. The generation and/or updating of the profiles may be optimized for the frequency and type of queries to use the stored data during data analytics tasks. Alternatively or additionally, the data owner can specify preferences upfront. This can be meaningful in scenarios where loss of data must be avoided to the maximum extent.

The different compression profile information for different data owners and/or different data sources can be combined to compensate for missing information in some profiles. Alternatively or additionally, a clustering of compression profiles can be performed to ensure that systems can use compression profiles for data without actually having detailed a priori knowledge of profiles of the data. System knowledge (e.g., on the behavior and properties of power grids) can be exploited by the machine learning engine to enable reasoning on extracted profiles and provide corrections where necessary. Alternatively or additionally, statistical features like correlations and/or physical interdependencies in system components and measurements can be used to improve the models and profiles.

Various effects and advantages are attained by the method, device, and system according to embodiments.

Storage space requirements and the required communication bandwidth, e.g. for transmitting the compressed data to storage devices, are reduced. The automatic selection of compression algorithms reduces the engineering effort.

Existing data analysis methods can be extended and improved due to availability of significantly more data during evaluations. The enhanced analysis options enable Transmission System Operators (TSOs) and Distribution System Operators (DSOs) to run their systems closer to their capacity limits by ensuring a secure supply of energy.

Higher forecasting accuracy can be attained based on the compressed data, which enables a safer operation of the grids or IACS and also provides advantages when it comes to energy trading and resource investigations (e.g., coal, gas).

The enhanced data analysis options allow maintenance and extension options to be recommended more reliably. Alternatively or additionally, the enhanced data analysis options allow energy on various voltage levels to be dynamically traded and delivered.

BRIEF DESCRIPTION OF THE DRAWINGS

The subject-matter of the present disclosure will be explained in more detail with reference to preferred exemplary embodiments which are illustrated in the attached drawings, in which.

DETAILED DESCRIPTION OF EMBODIMENTS

Exemplary embodiments will be described with reference to the drawings in which identical or similar reference signs designate identical or similar elements. While some embodiments will be described in the context of a power generation system or power distribution system, the methods and devices described in detail below may be used in a wide variety of systems.

The features of embodiments may be combined with each other, unless specifically noted otherwise.

According to embodiments, a machine learning approach is employed to compress data provided by a plurality of data sources of an industrial automation control system (IACS), power generation system or power distribution system in a manner that supports detailed long-term analyses while reducing the needed physical storage. This allows communication bandwidths needed for transmitting the data from the data sources to storage devices to be reduced. Data can be stored more efficiently. The optimized storage attained by an automatically determined compression allows the data to be stored over much longer time intervals for analysis, for a given available storage capacity.

Figure 1:
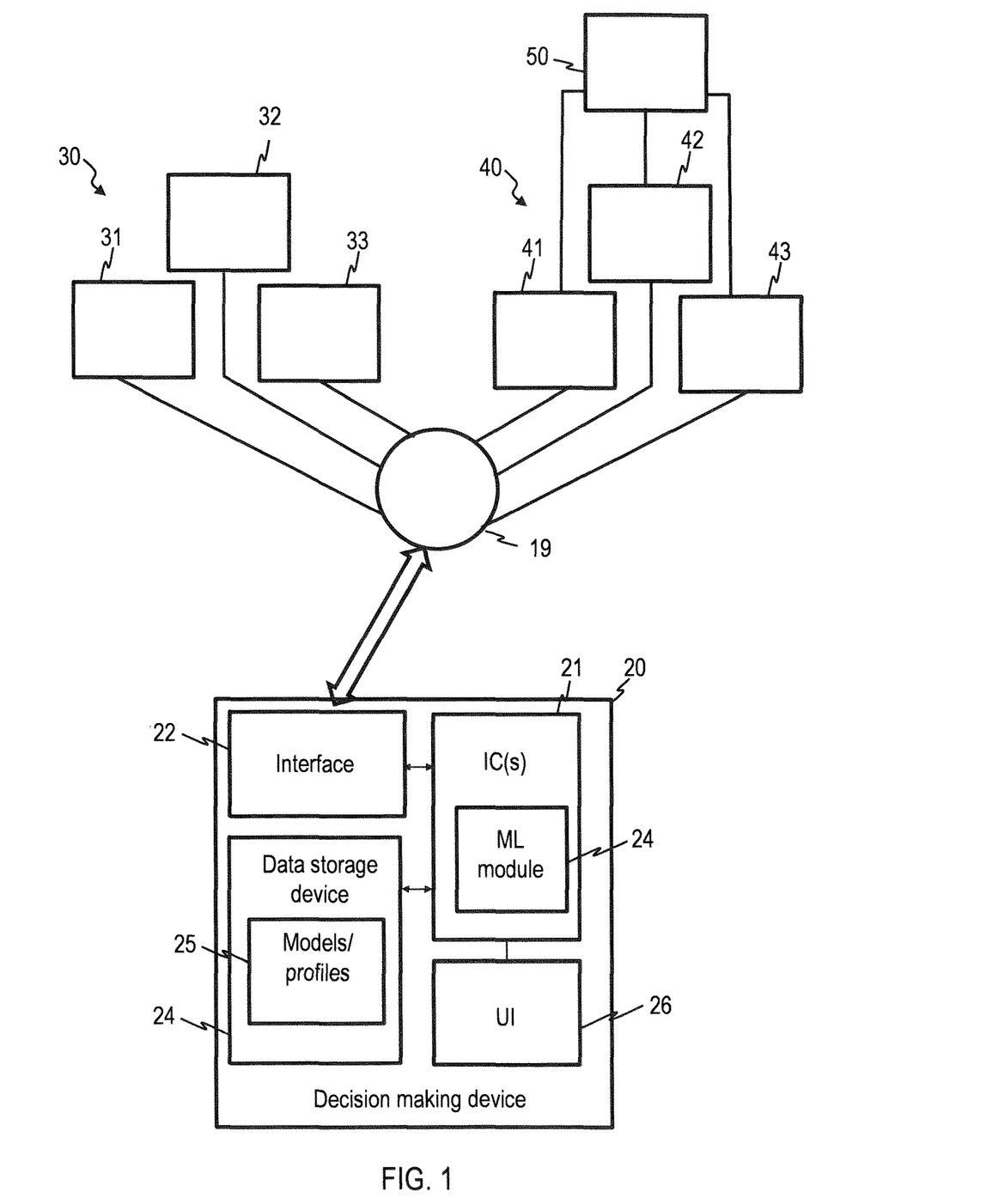
FIG. 1 is a schematic representation of a system comprising a decision making device according to an embodiment.

FIG. 1 is a schematic representation of a system according to an embodiment.

The system comprises a plurality of data sources 31, 32, 33, collectively referred to as data sources 30. The data sources 31, 32, 33 may respectively be sensors, merging units, intelligent electronic devices (IEDs) or other devices that provide data relating to operation of an IACS, power generation system or power distribution system. The data sources 31, 32, 33 may output the data in digital form. The data sources 31, 32, 33 may output data in the time domain and/or frequency domain. At least some of the data sources 31, 32, 33 may output a data stream, including non-packetized data.

As will be explained in more detail below, the data sources 31, 32, 33 may each be operative to compress the data prior to transmission, employing a compression technique that is determined using a machine learning approach.

The system comprises one or several storage devices 41, 42, 43. The storage devices are collectively referred to as at least one storage device 40. The storage device(s) 41, 42, 43 may be operative to store compressed data from the data sources 31, 32, 33 for subsequent analysis. The storage device(s) 41, 42, 43 may store information relating to a data model or profile associated with the data sources 31, 32, 33 when storing the compressed data.

The storage device(s) 41, 42, 43 may include a non-volatile storage medium having a capacity to store compressed data that represents a time period that exceeds 24 hours, a time period that exceeds 7 days, a time period that exceeds 28 days, a time period that exceeds 3 months, a time period that exceeds 1 year, a time period that is at least two years, or a time period that is at least three years.

The storage device(s) 41, 42, 43 may also store information on changes in compression technique applied to the data from various sources and/or changes in parameters of the compression algorithm. The storage device(s) 41, 42, 43 may store such information that relate to changes in compression profiles with associated time information that indicates the time at which the change has taken effect.

The system may comprise an analysis device 50. The analysis device 50 may be operative to retrieve stored data from the storage device(s) 41, 42, 43 for further analysis.

The analysis device 50 may be operative to analyze suitability of a power distribution system or power generation system for accommodating increasing customer demands of a power distribution system or a power generation system, based on the compressed data provided by the data sources 31, 32, 33.

Alternatively or additionally, the analysis device 50 may be operative to perform a stability analysis of a power distribution system or power generation system of a power distribution system or a power generation system, based on the compressed data provided by the data sources 31, 32, 33.

Alternatively or additionally, the analysis device 50 may be operative to determine a grid extension strategy of a power distribution system or a power generation system, based on the compressed data provided by the data sources 31, 32, 33.

The analysis device 50 may be operative to perform a long-term analysis of the compressed data. The long-term analysis may include extracting trends that can be seen only on longer time scales, e.g., based on compressed data that represents a time period that exceeds 24 hours, a time period that exceeds 7 days, a time period that exceeds 28 days, a time period that exceeds 3 months, a time period that exceeds 1 year, a time period that is at least two years, or a time period that is at least three years.

Importantly, and as will be explained in detail below, the manner in which data is processed at the data sources 31, 32, 33 prior to outputting the data is determined by a decision making device 20. The decision making device 20 employs a machine learning algorithm to determine which compression technique is to be applied to the data at the data sources 31, 32, 33 prior to outputting and/or to set parameter(s) of the compression techniques applied to the data at the data sources 31, 32, 33 prior to outputting.

In this manner, the decision making device 20 may generate profiles or models for data compression. This may be done separately for each data source 31, 32, 33 or for groups of data sources, depending on, e.g., the type of data, the amount of data, or the data ownership.

The decision making device 20 generally includes an interface 22 that is operable to output information to the data sources 31, 32, 33. The decision making device 20 may provide information on changes in a compression technique that is to be employed by a data source 31, 32, 33 to the respective data source 31, 32, 33 via a push mechanism. The decision making device 20 may provide information on changes in a compression technique that is to be employed by a data source 31, 32, 33 to the storage device(s) 41, 42, 43, e.g., via a push mechanism. Information on changes in the compression technique may be transmitted as incremental updates, indicating a change in compression profile or data model.

The interface 22 may optionally be operative to receive information from the analysis device 50 and/or from the data sources 31, 32, 33 and/or from the storage device(s) 40. The received information may allow the decision making device 20 to determine, using a suitable quality metric (such as compression and/or loss incurred during compression and/or quality of the results generated by the analysis device 50) in dependence on the compression that is being applied by the data sources, whether and how a machine learning algorithm for selecting the compression technique is to be modified. The received information may be used by the decision making device 20 to train a machine learning algorithm 24 during ongoing operation of the IACS, power generation system or power distribution system in which the data sources 31, 32, 33 are installed.

Alternatively or additionally, a user interface 26 may allow a Transmission System Operator (TSO) or Distribution System Operator (DSO) to provide input that can be used to train the machine learning algorithm 24 executed by the decision making device 20, e.g., during ongoing operation of an IACS, power generation system or power distribution system. The input received at the user interface 26 may be indicative of a quality of the compression performed by the data sources 31, 32, 33 as perceived by the TSO or DSO.

The decision making device 20 includes at least one integrated circuit 21. The at least one integrated circuit may comprise a processor, a microprocessor, a controller, a microcontroller, and application specific integrated circuit (ASIC) or any combination thereof. The at least one integrated circuit may be operative to execute a machine learning module 24. The machine learning module 24 may include statistical methods, reinforcement learning, a neural network, a convolutional neural network, an adversarial neural network, classifier techniques, or other suitable machine learning implementations.

The machine learning module 24 may be initialized by training it using historical data. Alternatively or additionally, system-specific expert knowledge relating to the IACS, the power generation system or power distribution system may be used. For illustration, the machine learning module 24 may be operative to exploit system knowledge (e.g., on the behavior and properties of power grids) to enable reasoning on the extracted compression profiles and provide corrections where necessary. Alternatively or additionally, the machine learning module 24 can use statistical features like correlations and (physical) interdependencies in systems such as IACSs and power system to improve the models and profiles.

The decision making device 20 includes at least one data storage device or memory 24. The data storage device or memory 24 is operative to store information 25 on data models or profiles used for compression in a non-volatile manner. The information 25 may include, for the data sources 31, 32, 33, information on the compression technique that is to be employed by the data sources 31, 32, 33 and information on parameters of the respective compression technique. For illustration, for run-length encoding (RLE), the parameters may indicate minimum and maximum lengths of the repeating sequence for which RLE is performed. For further illustration, for lossy compression, the parameters may define the degree of information loss that may be incurred by the compression.

The data model or profile used for compression may, but does not need to be provided separately for each of the data sources 31, 32, 33. For illustration, if information is missing for the profiles of some data sources 31, 32, 33, the available profile information can be used in combination to compensate for the missing information in some profiles. Alternatively or additionally, a clustering of the profiles can be performed to ensure that profiles for data can be used without actually having detailed a priori profiles of the data. Known clustering techniques can be used to this end. System knowledge (e.g., on the behavior and properties of power grids or an IACS) can be exploited by the machine learning module 24 to infer the missing information. Statistical features like correlations and physical interdependencies can be used by the at least one integrated circuit 21 to improve the models and profiles 25.

The decision making device 20, the data sources 31, 32, 33, the storage device(s) 41, 42, 43, and optionally the analysis device 50 may communicate via a suitable communication bus or network 19.

During operation, the decision making device 20 can assign signals to classes and models that are stored to represent the various original data collected at the data sources 31, 32, 33. The data may represent electric currents, voltages, switch parameters (such as switch states or operations states of switch motors), transformer condition parameters (such as parameters relating to a bushing or insulation of a transformer), or other data relating to operation of a power generation system, power distribution system, or industrial system.

The decision making device 20 is able to optimize the compression by automatically choosing from various compression techniques and determining the compression parameters for each of the data sources 31, 32, 33. The system can be self-optimizing, which also reduces the engineering effort. Compression is not restricted to Lempel-Ziv-type compression algorithms and similar approaches, and can make use of patterns/similarities between data in the same dataset or even between different datasets from different sources. Compression is implemented with a machine learning based decision making device 20 that can determine when to use which kind of compression.

The decision making device 20 can assign signals to classes and models 25. The models 25 may be dependent on the various original data of the data sources 31, 32, 33. A machine learning method is used to update the models 25 with new data. This can form the basis to build or update lossy and lossless profiles representing the data to be stored, using, e.g., statistical methods, neural networks or reinforcement learning. User preferences may be taken into account, e.g., to enforce lossless compression for certain data sources.

Information on the frequency and type of queries output by the analysis device 50 to use the stored data during data analytics may be taken into consideration when determining the optimum compression technique or compression parameters.

For illustration, a compression technique that allows data to be uncompressed more rapidly can be preferred for data that is queried more frequently by the analysis device 50, even when this may result in a less pronounced reduction storage space for the compressed data. A compression technique that provides more pronounced reduction in data size during compression can be preferred for data that is queried infrequently by the analysis device 50.

Alternatively or additionally, a data owner can specify preferences upfront. This can be useful in scenarios where loss of data must be avoided to the maximum extent. For illustration, TSOs or DSOs may want to ensure that data representing system quantities in a power grid or power generation system that may result in catastrophic failure are compressed only in a lossless manner.

To minimize the amount of control data relating to the compression techniques that needs to be exchanged between the plural data sources 30 and the decision making device 20 and/or between the storage device(s) 40 and the decision making device 20, the models/profiles can be pushed to the data sources 31, 32, 33 that are responsible for sensing or to the first digital processing step. In such a case, only update information relating to the updating of the models/profiles needs to be transmitted to the processing and storage devices 41, 42, 43, 50. Similarly, the storage devices 41, 42, 43 only need to store the profiles and/or changes in the models. The update information can be transmitted as incremental update that includes, e.g., information on parameter changes in the models/profiles for the data sources 31, 32, 33.

Compression and optionally encryption can be used to ensure privacy-preservation and confidentiality. For illustration, the techniques described in M. Harvan, S. Kimoto, T. Locher, Y.-A. Pignolet and J. Schneider, "Processing Encrypted and Compressed Time Series Data," 37th IEEE International Conference on Distributed Computing Systems (ICDCS), 2017 can be used to ensure privacy-preservation. The compression and, if applicable, encryption methods can be tailored by the decision making device 20 to the data originating from the data sources 31, 32, 33 and the queries of the analysis device 50 during analytics.

The candidate compression techniques from which the compression technique used by a data source 31, 32, 33 is selected are not particularly limited. Examples for efficient compression techniques that can be used include, e.g., lossy compression via piecewise regression (using, e.g., the technique described in F. Eichinger, P. Efros, S. Karnouskos, and K. Bohm, "A Time-Series Compression Technique and its Application to the Smart Grid". The VLDB Journal, 24(2), 193-218, 2015.) or lossless compression using run-length encoding (using, e.g., the technique described in F. Fusco, M. Vlachos, and X. Dimitropoulos, "RasterZip: Compressing Network Monitoring Data with Support for Partial Decompression." Proc. ACM Internet Measurement Conference (IMC), 2012).

Figure 2:
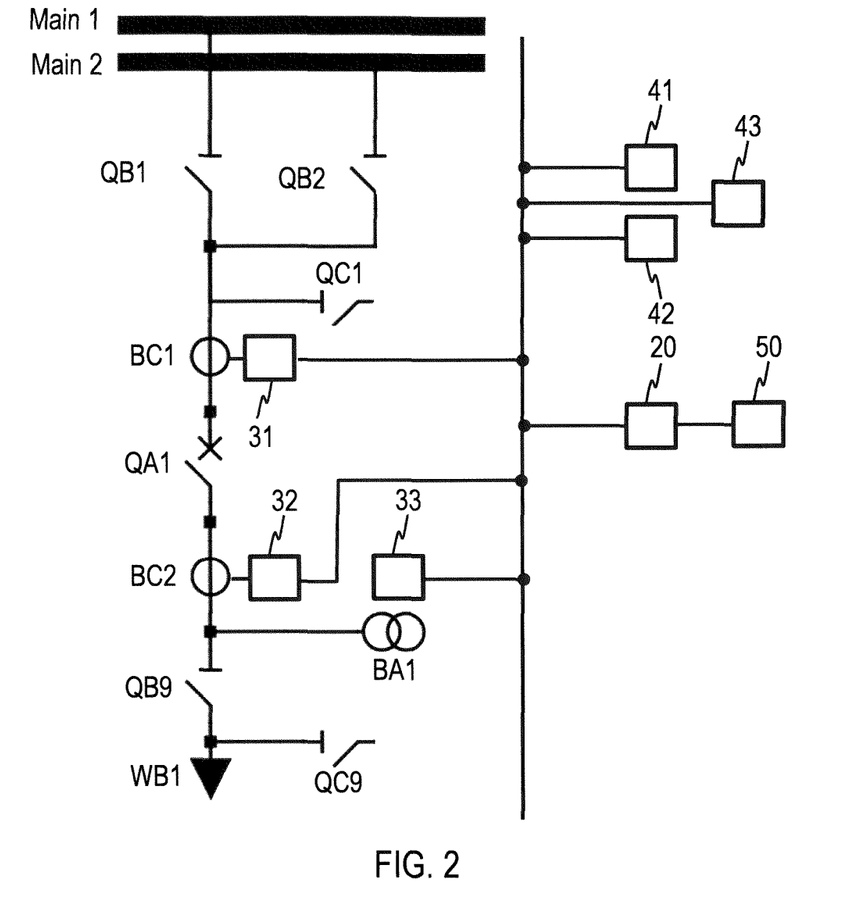
FIG. 2 is a schematic representation of a system comprising a decision making device according to an embodiment.

FIG. 2 is a schematic diagram illustrating a decision making device 20, storage device(s) 41, 42, 43 and analysis device 50 used in conjunction with components of a power distribution or generation system. For illustration, a bay of a power substation may include switches QB1, QB2, QC2, AQ1, QB9, and QC9, transformers BC1, BC2 for current sensing and transformers BA1 for voltage sensing. The sensor devices 31, 32, 33 are the first components that provide digital data output and that apply compression techniques determined based on the machine learning approach of the decision making device 20.

The decision making device 20 is adapted to automatically select and improve the compression that is applied by the data sources 31, 32, 33. The decision making device 20 may employ the machine learning approach to select and improve the compression.

Figure 3:
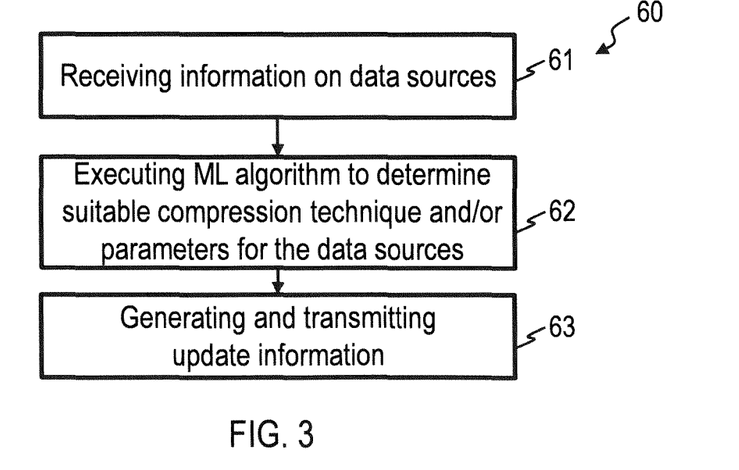
FIG. 3 is flow chart of a method according to an embodiment.

FIG. 3 is a flow chart of a method 60 according to an embodiment. The method 60 may be performed by the decision making device 20.

At step 61, information on the data sources 31, 32, 33 is received. The information may be obtained by user input or by analyzing a configuration file. The configuration file may be a standardized configuration description or a proprietary configuration description of the IACS, power distribution system or power generation system.

At step 62, a machine learning algorithm is executed to determine suitable compression techniques and/or compression parameters for the data sources 31, 32, 33. The machine learning algorithm that is executed by the decision making device 20 may continue to learn during operation of the IACS, power distribution system or power generation system and/or during data analytics performed by the analysis device 50.

At step 63, update information is generated and transmitted. The update information may indicate changes in the profile or data model used for compression by the data sources 31, 32, 33. The update information may be transmitted via a push mechanism to the data sources 31, 32, 33 and the storage device(s) 41, 42, 43. The update information may include information on the time at which the update of the compression technique takes effect.

The update information may be used by the data sources 31, 32, 33 and the storage device(s) 41, 42, 43 to update the locally stored profiles or models.

Figure 4:
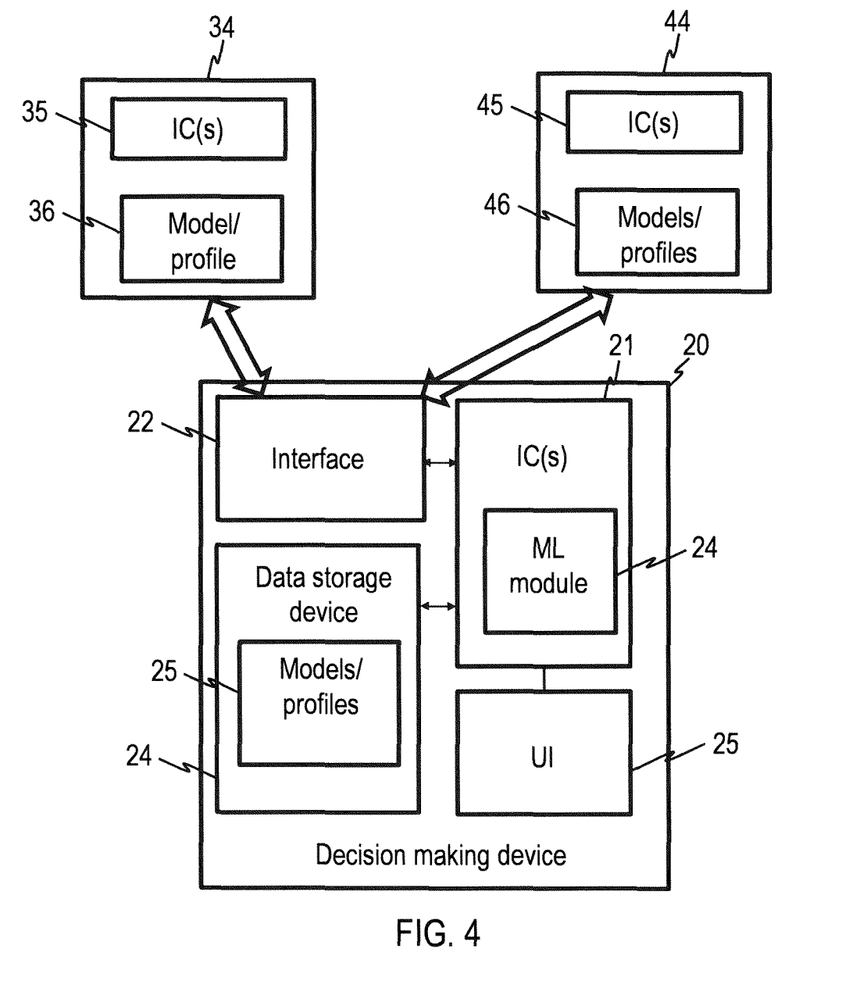
FIG. 4 is a schematic representation of a system comprising a decision making device according to an embodiment.

FIG. 4 is a schematic block diagram of a system according to an embodiment. A data source 34 may provide data that is indicative of at least one parameter of an IACS, power generation system or power distribution system. The data source 34 may include at least one integrated circuit 35. The at least one integrated circuit may comprise a processor, a microprocessor, a controller, a microcontroller, and application specific integrated circuit (ASIC) or any combination thereof.

The data source 34 may include a non-volatile storage or memory device that locally stores information on a data model or profile 36 used for data compression. The data model or profile may determine which compression is applied to data by the data source 34 prior to outputting the data. The data model or profile may determine parameters of the respective compression algorithm determined by the decision making device 20.

During operation, in response to update information from the decision making device 20, the at least one integrated circuit 35 may update the locally stored model or profile. For illustration, parameters or even the type of compression technique may be changed in dependence on the received update information. The updated model or profile may take effect and may be applied from a time that is specified by the decision making device 20.

A storage device 44 may provide data that is indicative of at least one parameter of an IACS, power generation system or power distribution system. The storage device 44 may include at least one integrated circuit 45. The at least one integrated circuit may comprise a processor, a microprocessor, a controller, a microcontroller, and application specific integrated circuit (ASIC) or any combination thereof.

The storage device 44 may include a non-volatile storage or memory device that locally stores information on a data model or profile 46 that is used by the data source 34 for data compression. The data model or profile may determine which compression is applied to data by data source 34 prior to outputting the data. The data model or profile may determine parameters of the respective compression algorithm determined by the decision making device 20. The data model or profile may determine the uncompressing algorithm that must be applied to the stored compressed data, e.g., during analytics of the data.

During operation, in response to update information from the decision making device 20, the at least one integrated circuit 45 may update the locally stored model or profile. For illustration, parameters or even the type of compression technique may be changed in dependence on the received update information. The updated model or profile may be recorded in association with a time that is specified by the decision making device 20.

The update information that is transmitted by the decision making device 20 using, e.g., a push mechanism may be incremental update information. For illustration, only changes in the profile or model may be communicated by the decision making device 20 to the data source 34 and the storage device 44.

It will be appreciated that each of the plural data sources 31, 32, 33 and, if present, each of several storage devices 41, 42, 43 may be operative as described with reference to FIG. 4.

Figure 5:
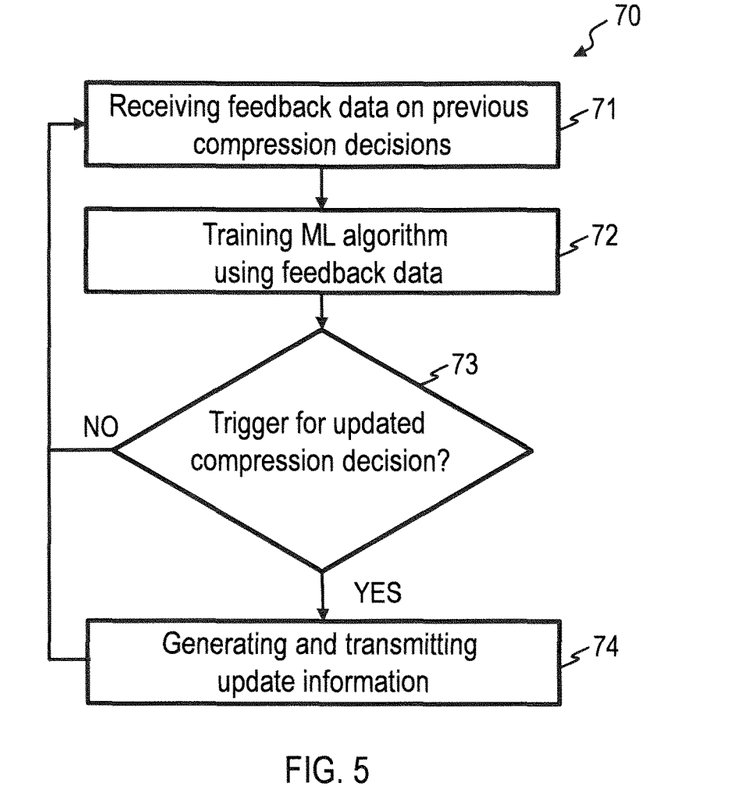
FIG. 5 is flow chart of a method according to an embodiment.

FIG. 5 is a flow chart of a method 70 according to an embodiment. The method 70 may be performed by the decision making device 20.

At step 71, feedback data on previous compression decisions may be received. The feedback data may be provided automatically by the analysis device 50, the storage device(s) 40 and/or the data sources 31, 32, 33. The feedback data may include quality metrics or information that allows the decision making device 20 to determine a numerical value indicative of a quality of the compressed data for subsequent analytics. Alternatively or additionally, the feedback data may be input via user interface 26.

At step 72, the machine learning algorithm may be trained using the feedback data. The training may include neural network training, reinforcement learning, or other machine learning approaches.

At step 73, it is determined whether a trigger condition for communicating updated compression decisions to the data sources 31, 32, 33, the storage device(s) 40, and/or the analysis device 50 is fulfilled. If the trigger condition is not fulfilled, the method may return to step 71. If the trigger condition is fulfilled, at step 74 the update information relating to changes in compression techniques may be generated and pushed to the data sources 31, 32, 33, the storage device(s) 40, and/or the analysis device 50.

Constraints may be used when determining the compression techniques and parameters that are to be used by the data sources 31, 32, 33. The constraints may be imposed automatically by the decision making device 20, using, e.g., expert knowledge on various data sources and/or information included in a configuration file of the IACS, power generation system or power distribution system. The constraints may be input by an operator.

Figure 6:
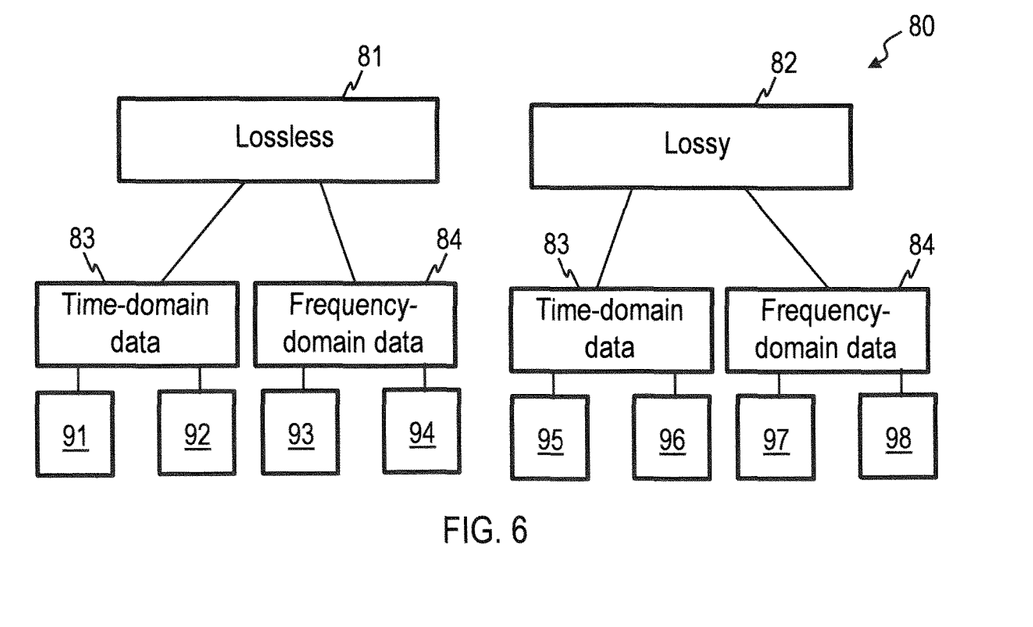
FIG. 6 is a schematic representation illustrating the determination of compression techniques using machine learning.

FIG. 6 illustrates a selection from among candidate compression techniques 91-98 based on imposed constraints. For illustration, some compression techniques 91, 92 may be applicable to the lossless compression of time-domain data. Other compression techniques 93, 94 may be applicable to the lossless compression of frequency-domain data. Other compression techniques 95, 96 may be applicable to the lossy compression of time-domain data. Other compression techniques 97, 98 may be applicable to the lossy compression of frequency-domain data. The possible compression techniques may be selected from a sub-set of all candidate compression techniques 91-98 depending on whether the lossless or lossy compression is to be performed and/or depending on whether the data is time-domain data or frequency-domain data. Groups 81, 82, 83, 84 of compression algorithms may be defined.

Devices and methods according to embodiments may use a machine learning approach to compress data for transmission, storage and/or analysis in a manner that can support detailed long-term analyses while minimizing the needed physical storage. This allows operators to collect more data (by reducing the communication bandwidth needed for transmitting the data from the sensors to the storage system) and to store it more efficiently over much longer time intervals. Thus, data compressed using machine learning techniques enables new services and products.

The machine learning approach may be able to optimize the compression by automatically choosing from various compression methodologies and/or determining the compression parameters for each data set/data stream. This way, the system can be self-optimizing, which also reduces the engineering effort. Compression is not restricted to Lempel-Ziv-type compression algorithms and similar approaches. Compression can make use of patterns/similarities between data in the same dataset or even between different datasets. The methods and devices according to embodiments allow compression algorithms to be implemented with a machine learning based decision maker that determines when to use which kind of compression makes the solution unique.

The generation of long-term storage and profile management may include an analysis of a variety of features, in the time and/or frequency domain. Data can be stored in an efficient manner using different kinds of methods, including compression, signal analysis and processing, and signals correlations to derive representative statistics, classification algorithms to assign signals to classes and models that are stored to represent the various original data.

A machine learning method can be used to update models trained on available past data with new data. This can form the basis to build lossy and lossless profiles (depending on the data owner preferences) representing the data to be stored (e.g., using statistical methods, or neural networks and reinforcement learning). As such a procedure provides various adjustable parameters, this step may be optimized for the frequency and type of queries to use the stored data during a data analytics task. Alternatively or additionally, a data owner can specify preferences upfront. This can be meaningful in scenarios where loss of data must be avoided to the maximum extent.

The methods and system according to embodiments allow compression to be optimized. Different compression algorithms exist that focus on storing the data in a more compact fashion. One can for example use classical Lempel-Ziv type compression techniques that compress the digital data in a generic fashion in a lossless way. However, there are also compression techniques that actually loses information but is in many cases acceptable. Embodiments provide a method or module that can automatically select between several (predefined) methods for compression and parameterizes these algorithms accordingly. The execution of the compression can then be done on other devices within the system, e.g., close to the origin of the data in order to safe communication bandwidth and/or at storage devices.

The methods and systems may revise the decision on which compression algorithm is used and/or the parameterization of the algorithm in a regular fashion in order to further optimize the system assuming that the data source might change over time.

Figure 7:
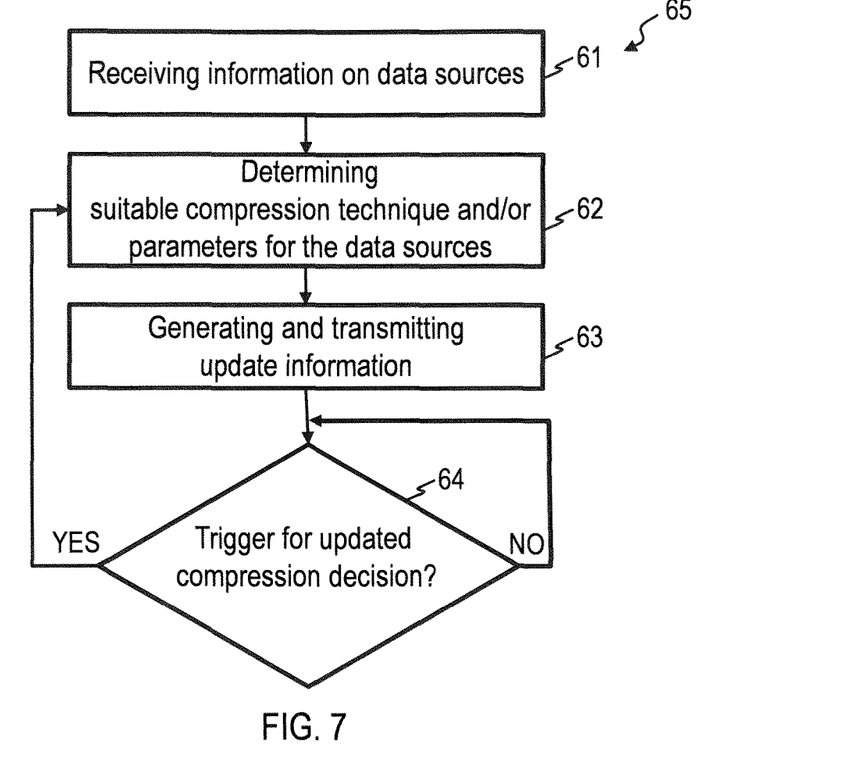
FIG. 7 is flow chart of a method according to an embodiment.

FIG. 7 is a flow chart of a method 65 that may be automatically performed. Steps 61-63 may be implemented as explained with reference to FIG. 3 to automatically determine which one of several compression algorithms is to be used and/or to parameterize the compression algorithm.

At step 64, it is determined whether a trigger for an updated compression decision is satisfied. The trigger at step 64 may be expiry of a timer, such that the determination of the compression algorithm to be used and its parametrization may be repeated in a regular manner, e.g. periodically. The trigger at step 64 may be a trigger event, such that the determination of the compression algorithm to be used and its parametrization may be repeated in an event-driven manner.

Thus, the decision on which compression algorithm is used and/or the parameterization of the algorithm in a regular fashion in order to further optimize the system assuming that the data source might change over time.

The data from the data sources may be time-series data. Power consumption as a function of time is an example for such time-series data, without being limited thereto. The time series data may be electricity consumption of households, for example.

One or several of the candidate compression algorithms may correlate the time-series data for different data sources (e.g., for different households). Set(s) of time-series data may be formed by grouping time-series data from different data sourced based on the correlation. The time-series data may be grouped into set(s) such that all time-series data in a set are sufficiently similar to fulfill a correlation criterion. For illustration, the cross-correlation between any pair of time-series data grouped in a set may meet a threshold criterion (e.g., may exceed a threshold).

One or several of the candidate compression algorithms may be implemented in such a way that for any set of time-series data grouped as described above, only the time-series data originating from one of the data sources is transmitted and/or stored. For the other data sources that are grouped to belong to the same set, the compression algorithm may provide an indicator identifying the time-series data originating from these data sources to be correlated with the time-series data of the one data source in the set for which the time-series data is stored.

I.e., the compression mechanism could correlate the time series of different data sourced with each other and only communicate a few of them (in a further compressed format) and specify that other consumption pattern are very similar (with some information loss). This avoids communicating all individual curves of time-series data.

The compression mechanism may additionally use a clustering technique to classify the different time-series data (e.g., consumption patterns) into a number of classes. The classes may vary as a function of time, e.g., as a function of day of week, as a function of month, etc. For illustration, there can be X classes for Mondays, Y classes for Tuesdays etc. Then, the compression algorithm could identify the time-series data (e.g., the consumption pattern) for a specific day and then communicate the class number instead of the time-series data for transmission and/or storage. This results in compact storage.

The machine learning algorithm may learn the criteria for grouping time-series data into a set and/or for classifying signals. For illustration, the machine learning algorithm may receive quality feedback during ongoing operation of the system and/or during data analytics. The quality feedback may include expert feedback received via an interface and/or quantitative feedback automatically generated by the system. The machine learning algorithm may adjust the correlation criterion used for correlating data and/or the number and types of classes during ongoing operation to learn optimum ways of selecting the compression algorithm and its parameterization.

Compression techniques that involve a loss of information may be employed selectively only if information loss is acceptable.

The machine learning algorithm may automatically decide on whether lossy or lossless compression is to be employed. For illustration, the machine learning algorithm may determine the granularity and/or format of the required information, which may be inferred from the data itself and/or from metadata. For illustration, if the data is image data or other data with much redundant information that is not marked as critical, a lossy compression may be selected. If the data is recognized to include critical fields that may not be lost, lossless compression is selected.

Figure 8:
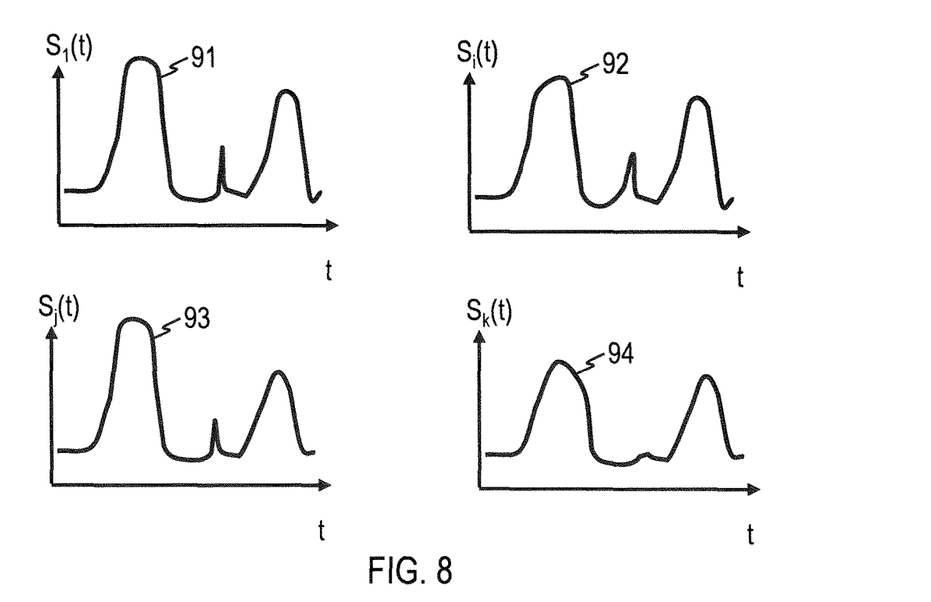
FIG. 8 is a schematic representation illustrating operation of an embodiment.

FIG. 8 illustrates exemplary data 91-94 from various data sources. The data 91-94 may respectively represent time-series data. One candidate compression algorithm may compute cross-correlations of the time series data 91-94 with each other and compare the result to a threshold.

The compression algorithm may cause only one of the time-series data that are considered to comply with a correlation criterion (e.g., time-series data 91 from a first source) to be transmitted and/or stored, optionally after further processing.

The compression algorithm may cause an indicator to be transmitted and/or stored instead of transmission and/or storage of the data 92, 93 from other sources. The indicator may indicate that the data 92, 93 are correlated with the time-series data 91.

The machine learning algorithm may adjust the parameterization of the compression algorithm, based on received feedback, as has been explained with reference to, e.g., FIG. 5.

For illustration, a threshold value which determines whether data 94 from a source meets a correlation criterion that allows the data 94 to be grouped with the time-series data 91 from another source (such that transmission and/or storage of one of the time-series data 91, 94 may be replaced by transmission and/or storage of an indicator indicating the similarity) may be learned during ongoing operation. This may be done by incrementing and/or decrementing the threshold used in a correlation threshold comparison, based on received feedback.

For signal processing, it can be beneficial to either compress the time or the frequency domain over a period of time. In the methods and systems, the machine learning algorithm can learn whether compression in the time or frequency domain is more beneficial. This may be done based on received feedback, as has been explained with reference to, e.g., FIG. 5.

Some of the compression algorithms may be adapted to compare signals with either other signals in the system (as has been explained with reference to FIG. 8) or other signals in the past. Correlation values could be used to identify signals that are sufficiently similar to meet a correlation threshold criterion. It is not required to transmit and/or store every signal of a group of signals that are considered to be similar. The machine learning algorithm learns over time and adjust over time which method to use. This may be done based on received feedback, as has been explained with reference to, e.g., FIG. 5.

Not only signals, but different profile information can be combined to compensate for missing information in some profiles. A clustering of profiles can be used to ensure that systems can use profiles for data without actually having detailed profiles of the data. To this end, system knowledge (e.g., on the behavior and properties of power grids) may be exploited by the machine learning algorithm to enable reasoning on extracted profiles and provide corrections where necessary. Statistical features like correlations and/or (physical) interdependencies can be used to improve the models and profiles.

To minimize the amount of data to be exchanged, the models/profiles can be pushed to the devices that are responsible for sensing or to the first digital processing step. In such a case, only data updating the models/profiles need to be transmitted towards further processing and storing facilities. The storage devices only need to store the profiles and/or changes in the models. Various effects and advantages are attained by the methods, devices, and systems according to embodiments. For illustration, storage space requirements and the required communication bandwidth are reduced. The automatic selection of compression algorithms reduces the engineering effort.

While embodiments have been described in detail in the drawings and foregoing description, such description is to be considered illustrative or exemplary and not restrictive. Variations to the disclosed embodiments can be understood and effected by those skilled in the art and practicing the claimed embodiments, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

The invention claimed is:

1. A method of facilitating storage of data from plural data sources of a system, the system being an industrial automation control system (IACS), power distribution system, or power generation system, the method comprising:
   determining, using at least one integrated circuit of a decision making device, a compression technique that is to be applied to the data, wherein the decision making device executes a machine learning algorithm to determine the compression technique in dependence on a data source from which the data originates, wherein determining the compression technique comprises executing the machine learning algorithm to generate an update of a data model or profile associated with the data source;
   causing, by the decision making device, the compression technique determined for the data source to be applied to data from that data source by generating update information relating to the update of the data model or profile, and transmitting the update information to the data source for which the update of the data model or profile has been determined;
   updating, by the data source, a compression model or profile stored locally at the data source based on received update information to thereby generate an updated compression model or profile; and
   performing, by the data source, a compression based on the updated compression model or profile.

2. The method of claim 1, wherein information on changes in a compression technique that is to be employed is provided by the decision making device to the respective data source and/or to storage devices via a push mechanism.

3. The method of claim 2, wherein the information on changes in a compression technique is transmitted as incremental updates, indicating a change in compression profile or data model.

4. The method of claim 1, wherein determining the compression technique comprises executing the machine learning algorithm to determine which one of several candidate compression techniques is to be applied.

5. The method of claim 1, wherein determining the compression technique comprises executing the machine learning algorithm to determine at least one parameter of the compression technique.

6. The method of claim 1, further comprising automatically repeating the steps of determining the compression technique and causing the compression technique to be applied, wherein the steps of determining the compression technique and causing the compression technique to be applied are repeated in a regular manner.

7. The method of claim 1, wherein the data source to which the update information is transmitted comprises a sensor device or a merging unit.

8. The method of claim 1, further comprising transmitting, by the decision making device, the update information to at least one storage device that stores the data from the data source.

9. The method of claim 1, wherein the machine learning algorithm determines the compression technique under a data-source dependent constraint.

10. The method of claim 1, further comprising:
    training the machine learning algorithm during operation of the IACS, power distribution system or power generation system,
    wherein training the machine learning algorithm comprises learning whether a compression in the time domain or a compression in the frequency domain is more beneficial.

11. The method of claim 1, wherein
    the determined compression technique determines correlations of time-series data of different data sources, wherein the method further comprises a transmission and/or storage of information that depends on the determined correlations, and/or
    wherein the determined compression technique comprises a classification or clustering technique, wherein the method further comprises a transmission and/or storage of information that indicates a class or cluster, and/or wherein the classification or clustering is time-dependent.

12. A decision making device adapted to facilitate storage of data from plural data sources of an industrial automation control system (IACS), power distribution system or power generation system, the decision making device comprising:
    at least one interface adapted to be communicatively coupled to the plural data sources; and
    at least one integrated circuit operative to
       determine a compression technique that is to be applied to the data, wherein the decision making device executes a machine learning algorithm to determine the compression technique in dependence on a data source, from among the plural data sources, from which the data originates, wherein determining the compression technique comprises executing the machine learning algorithm to generate an update of a data model or profile associated with the data source, and
       cause the compression technique determined for the data source to be applied to data from that data source by generating update information relating to the update of the data model or profile, and transmitting the update information to the data source for which the update of the data model or profile has been determined, such that the data source
          updates a compression model or profile stored locally at the data source based on received update information to thereby generate an updated compression model or profile, and
          performs a compression based on the updated compression model or profile.

13. The decision making device of claim 12, wherein the decision making device is adapted to provide information on changes in a compression technique that is to be employed to the respective data source and/or to storage devices via a push mechanism.

14. The decision making device of claim 13, wherein the decision making device is adapted to transmit the information on changes in a compression technique as incremental updates, indicating a change in compression profile or data model.

15. The decision making device of claim 12, wherein the at least one integrated circuit is operative to generate control information that causes the compression technique determined for a data source to be applied to the data originating from that data source before storing the data.

16. A system that is an industrial automation control system (IACS), power distribution system or power generation system, comprising:
- a plurality of data sources;
- at least one storage device to store compressed data originating from the plurality of data sources; and
- a decision making device adapted to facilitate storage of data from the plurality of data sources, the decision making device comprising
  - at least one interface adapted to be communicatively coupled to the plurality of data sources, and
  - at least one integrated circuit operative to
    - determine a compression technique that is to be applied to the data, wherein the decision making device executes a machine learning algorithm to determine the compression technique in dependence on a data source, from among the plurality of data sources, from which the data originates, wherein determining the compression technique comprises executing the machine learning algorithm to generate an update of a data model or profile associated with the data source, and
  - cause the compression technique determined for the data source to be applied to data from that data source by generating update information relating to the update of the data model or profile, and transmitting the update information to the data source for which the update of the data model or profile has been determined, such that the data source
    - updates a compression model or profile stored locally at the data source based on received update information to thereby generate an updated compression model or profile, and
    - performs a compression based on the updated compression model or profile.

* * * * *